United States Patent [19]
Kempf et al.

[11] Patent Number: 5,791,851
[45] Date of Patent: Aug. 11, 1998

[54] APPARATUS FOR TRANSFER OF WORKPIECES INTO AND OUT OF A COATING CHAMBER

[75] Inventors: Stefan Kempf, Alzenau; Michael König, Frankfurt, both of Germany

[73] Assignee: Balzers Und Leybold Aktiengesellschaft, Hanau, Germany

[21] Appl. No.: 495,333

[22] Filed: Jun. 27, 1995

[30] Foreign Application Priority Data

Aug. 8, 1994 [DE] Germany ............... 44 27 984.1

[51] Int. Cl.[6] ............................................. B65G 47/80
[52] U.S. Cl. .......................... 414/217; 414/941; 901/45
[58] Field of Search ......................... 414/744.2, 939, 414/941, 217; 901/45

[56] References Cited

U.S. PATENT DOCUMENTS

| | | | |
|---|---|---|---|
| 3,824,674 | 7/1974 | Inoyama et al. | 29/407 |
| 3,874,525 | 4/1975 | Hassan et al. | 214/17 B |
| 4,155,169 | 5/1979 | Drake et al. | 901/45 |
| 4,179,783 | 12/1979 | Inoyama et al. | 29/281.5 |
| 4,224,504 | 9/1980 | Erikson et al. | 219/388 |
| 4,290,203 | 9/1981 | Rebman | 901/45 |
| 4,379,363 | 4/1983 | Whitney | 901/45 |
| 4,529,353 | 7/1985 | Dean et al. | 414/941 |
| 4,820,106 | 4/1989 | Walde et al. | 414/217 |
| 4,952,117 | 8/1990 | Nerger | 901/45 |
| 5,017,073 | 5/1991 | Strasser et al. | 414/217 |
| 5,207,554 | 5/1993 | Asakawa et al. | 901/45 |
| 5,407,314 | 4/1995 | Kempf | 414/217 |
| 5,520,501 | 5/1996 | Kouno et al. | 414/941 |

FOREIGN PATENT DOCUMENTS

| | | |
|---|---|---|
| 159757 | 4/1983 | German Dem. Rep. . |
| 4009603 | 4/1990 | Germany . |
| 4302851 | 8/1994 | Germany . |

*Primary Examiner*—Thomas J. Brahan
*Attorney, Agent, or Firm*—Felfe & Lynch

[57] ABSTRACT

A pivot arm (3) is rotatable about an axis for delivering and removing a flat workpiece (24) into and out of the area of the lock (19) of an evacuable coating chamber (26). The pivot arm (3) is provided at its distal end with the retaining bolt (12) which is perpendicular to the plane (20) of the lock opening (19) and attached to a central part of a flexible diaphragm. The diaphragm is substantially parallel to the sealing surface of a workpiece carrier (16) and is fixed around its outer radial edge to the workpiece carrier so that the workpiece carrier (16) is able to tilt slightly during its vertical closing motion.

3 Claims, 1 Drawing Sheet

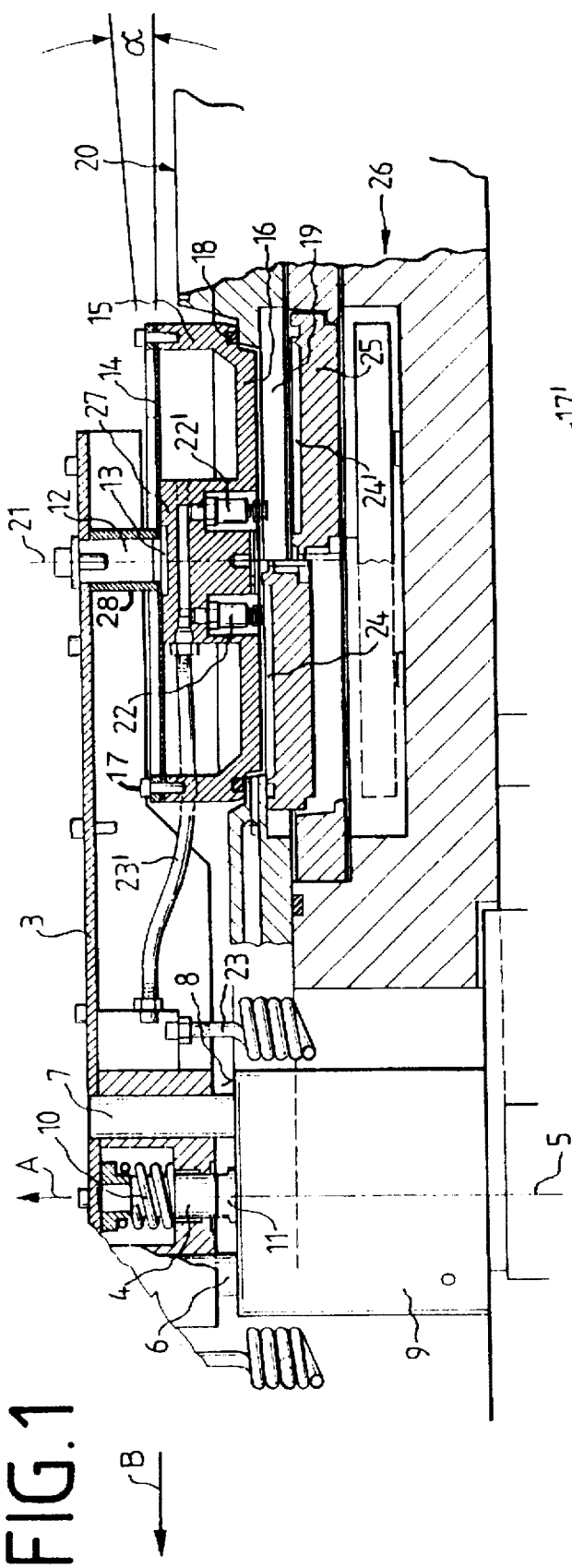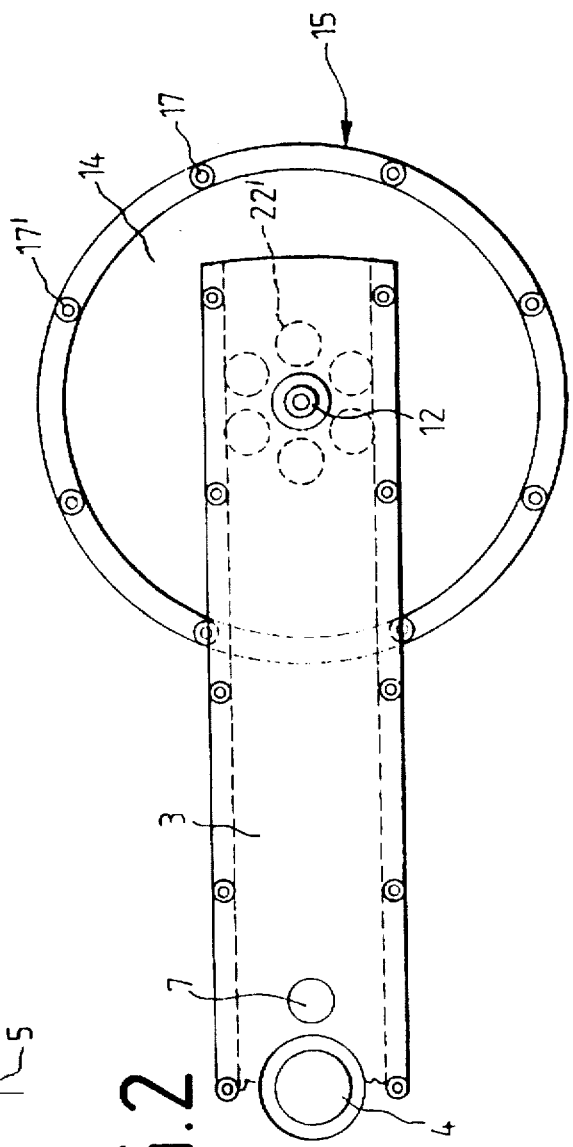

5,791,851

1

APPARATUS FOR TRANSFER OF WORKPIECES INTO AND OUT OF A COATING CHAMBER

BACKGROUND OF THE INVENTION

The invention pertains to a system for the inward transfer of an essentially flat workpiece into an evacuable coating chamber and its subsequent outward transfer and for moving the workpiece into and out of the area of a lock.

U.S. Pat. No. 3,874,525 discloses a coating chamber in which a two-armed gripping tool can be rotated around a vertical axis. This two-armed tool has forks at its diametrically opposite ends; with the help of a rack-and-pinion gearing with drive motor, these forks are able to move in opposite direction in the vertical plane. In addition, two brackets are installed in the coating chamber, one of which is mounted underneath a lock in the cover of the coating chamber, while the other is on the side opposite the first bracket, underneath an electron gun.

This known system has the disadvantage that the two-armed gripping tool has a comparatively complicated design and also does not work very reliably, because of the complicated geared drive. Furthermore, there is the danger with this system that the fork-shaped tool will not grip the workpiece satisfactorily, in which case the workpiece is either grasped on edge or is able to escape from the tool and fall to the bottom of the coating chamber, which unavoidably leads to the blockage or shutdown of the entire system. Finally, the known system is very tall, which makes it necessary for the coating chamber to be undesirably large.

U.S. Pat. No. 4,820,106 discloses a coating system with a coating chamber and a cathode as the coating source. The system is provided with a device for the inward and outward transfer of essentially flat workpieces into and out of the evacuatable coating chamber, which is formed by a cover, a floor plate extending in a plane parallel to the cover, and a ring-shaped side part, connecting the two other parts in a pressure-tight manner and separating them by a certain distance. A rotating table in the coating chamber transports the workpieces from a lock opening in the cover of the coating chamber to the coating source and back again. A coating device with one or more lid-like workpiece carriers is provided, by means of which the workpieces held underneath the workpiece carrier can be brought into a position adjacent to the lock opening of the coating chamber, from which point the lock opening can be closed from the top by means of the workpiece carrier and from the bottom by means of a lifting platform, this platform being mounted on and guided by the rotating table. The workpiece carrier can be pressed against the cover by a lifting cylinder supported on the coating device, and the lifting platform can be pressed against the cover by a stationary lifting device. The lock opening, after it has been closed on both sides, can then be evacuated for the inward and outward transfer.

The coating device has a pivoting motor permanently mounted on the top surface of the cover of the coating chamber; the take-off shaft of this motor is connected nonrotatably to a pivot arm extending crosswise to the take-off shaft. A lifting motor or lifting cylinder is provided at the end of at least one of the pivot arms, the working shaft or piston rod of which is perpendicular to the plane of the coating chamber and is connected to the workpiece carrier in such as way as to transmit force it.

This known device for the inward and outward transfer of workpieces suffers from the disadvantage that, especially as a result of the unavoidable operating wear on the drive shaft or its pivot bearing, the take-off shaft, which is supported on the cover of the coating chamber, often uses its pivot arm to set the cover-shaped workpiece carrier down on the lock opening with a certain tilt toward the plane of the coating chamber and to press it against the cover of the chamber. Practical experience has shown that even a minimal inclination of the workpiece carrier has the result that the space in the cover underneath the workpiece carrier in which the substrate is laid or from which the substrate is outwardly transferred cannot be evacuated quickly enough, because the gap between the workpiece carrier or workpiece carrier seal and the edge of the inward transfer lock opening is too large in comparison with the cross section of the channel which opens into the space and is connected to the vacuum pump.

SUMMARY OF THE INVENTION

The present invention is based on the task of improving a device of the type in question in such a way that any tilting in the support of the pivot arm does not affect the process of the sealing of the lock opening in the cover of the coating chamber.

This task is accomplished in accordance with the invention in that the pivot arm, which rotates around a stationary bearing, is provided at its free end with a plate-shaped workpiece carrier, the retaining bolt of which is perpendicular to the opening plane, couples the workpiece carrier to the pivot arm, and is rigidly connected to the central area of a membrane clamped around its edge to the workpiece carrier.

The membrane, in the form of a thin, flat piece of material, is capable of oscillating and thus makes it possible for the retaining bolt connected rigidly to it to tilt with respect to the plane in which the membrane extends and thus also makes it possible for the workpiece carrier to tilt relative to the pivot arm by a small amount. During the closing process, therefore, the workpiece carrier is always able to align itself with the plane of the lock opening or cover and thus prevent any possibility of leakage to the inward transfer space.

BRIEF DESCRIPTION OF THE DRAWING

FIG. 1 shows a cross section through workpiece carrier, one half of the pivot arm, and a part of the coating chamber; and FIG. 2 shows a top view onto one of the halves of the pivot arm with its associated workpiece carrier.

DETAILED DESCRIPTION OF THE PREFERRED EMBODIMENT

Pivot arm 3 is supported on a shaft 4 in such a way that it can rotate around a pivot axis 5 and can also be lifted in the direction of arrow A. Two bolts 6, 7, permanently attached to pivot arm 3, ensure that pivot arm 3 remains as close to perfectly horizontal as possible when in its closed position (as shown in FIG. 1), for which purpose bolts 6, 7 are supported at their lower ends by top surface 8 of a pivot drive housing 9, on which they solidly rest. To execute the pivoting motion, pivot arm 3 is raised by shaft 4 and swung around, during which process compression spring 10 ensures that pivot arm 3 rests without play on collar 11 of shaft 4. The free end of pivot arm 3 is fixed to a retaining bolt 12 by a top bolt 21. An annular diaphragm 14 is clamped between a tubular piece 28 and bolt head 13 of bolt 12.

Diaphragm 14 consists of a piece of sheet metal and is connected around its outer radial edge to peripheral edge 15 of workpiece carrier 16 by means of a plurality of screws 17. Workpiece carrier 16 has a toroidal sealing ring 18 as sealing element, by means of which it rests tightly on the upper edge of cover 20 when inward transfer lock opening 19 is closed. Whenever pivot arm 3 is not perfectly parallel to the plane of cover 20 of coating chamber 26, workpiece carrier 16 will tilt by angle α around clamping axis 21 on retaining bolt 12. When workpiece carrier 15 tilts by an angle α, the diaphragm is deformed slightly in the shape of an "S", but at the same time any motion of workpiece carrier 15 parallel to plane 20 (in the direction of arrow B) is prevented, so that the vertical closing motion remains unaffected by the oscillating or tilting motion. The bolt head 13 bears against a compression piece 27 on the top of the carrier 16 in order to provide a good seal.

Finally, workpiece carrier 15 is provided with several suction cups 22, 22' which are connected to vacuum lines 23, 23', either to raise a workpiece 24 (24' designates the other half of the workpiece in the position which it assumes after it has been lowered by platform 25 of the coating device) or to set it down in coating device 26 or on the coating device's lifting platform 25.

What is claimed is:

1. Apparatus for transfer of workpieces into and out of a coating chamber, said apparatus comprising an evacuable coating chamber having a lock opening, a pivot arm rotatable about an axis, said pivot arm having a distal end remote from said axis, said distal end being movable to a position over said lock opening as said arm rotates, a workpiece carrier having a sealing surface for closing said lock opening and a central compression piece, and a flexible diaphragm having an inner portion fixed to said distal end of said pivot arm by retaining means and an outer portion fixed to said workpiece carrier, said retaining means bearing against said central compression piece when said lock opening is closed.

2. Apparatus as in claim 1 wherein said diaphragm is an annular piece of sheet metal having an inner periphery fixed to said first arm by said retaining means and an outer periphery fixed to said workpiece carrier.

3. Apparatus as in claim 2 wherein said workpiece carrier is in the form of a cup having an outer rim to which said outer periphery of said diaphragm is fixed.

* * * * *